US010162085B2

(12) United States Patent
Lee et al.

(10) Patent No.: US 10,162,085 B2
(45) Date of Patent: Dec. 25, 2018

(54) LARGE AREA ORGANIC LIGHT EMITTING PANEL

(71) Applicant: Corning Precision Materials Co., Ltd., Chungcheongnam-do (KR)

(72) Inventors: Joo Young Lee, Chungcheongnam-do (KR); Kyoung Wook Park, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 78 days.

(21) Appl. No.: 15/106,161

(22) PCT Filed: Dec. 11, 2014

(86) PCT No.: PCT/KR2014/012206
§ 371 (c)(1),
(2) Date: Jun. 17, 2016

(87) PCT Pub. No.: WO2015/093784
PCT Pub. Date: Jun. 25, 2015

(65) Prior Publication Data
US 2016/0327696 A1    Nov. 10, 2016

(30) Foreign Application Priority Data

Dec. 18, 2013    (KR) ................. 10-2013-0157993

(51) Int. Cl.
*G02B 27/02*        (2006.01)
*G02B 5/02*         (2006.01)
(Continued)

(52) U.S. Cl.
CPC .............. *G02B 5/0242* (2013.01); *F21V 5/00* (2013.01); *G02B 5/0278* (2013.01);
(Continued)

(58) Field of Classification Search
CPC ..... G02F 1/13336; G02F 2001/133388; G02F 1/133504
See application file for complete search history.

(56) References Cited

U.S. PATENT DOCUMENTS

2002/0168793 A1*  11/2002  Izumi ................ G02F 1/13336
                                                                438/73
2005/0111211 A1    5/2005  Takeuchi
(Continued)

FOREIGN PATENT DOCUMENTS

JP    2001175204 A    6/2001
JP    2002055634 A    2/2002
(Continued)

OTHER PUBLICATIONS

International Search Report for Application No. PCT/KR2014/012206 dated Jan. 21, 2015.
Written Opinion of the International Searching Authority for Application No. PCT/KR2014/012206 dated Jan. 21, 2015.

*Primary Examiner* — Andrew Coughlin
(74) *Attorney, Agent, or Firm* — Lerner, David, Littenberg, Krumholz & Mentlik, LLP

(57) ABSTRACT

The present invention relates to a large area organic light emitting panel and, more particularly, to a large area organic light emitting panel which prevents an observer in front of the panel from recognizing a seam connecting organic light emitting panels, i.e. which can implement a seamless effect. To this end, the present invention provides a large area organic light emitting panel comprising: a plurality of organic light emitting panels arranged vertically and horizontally; and a seam part, formed between the plurality of organic light emitting panels, for connecting the plurality of organic light emitting panels and refracting, to the front, light laterally emitted from the organic light emitting panels by a wave guiding effect.

5 Claims, 2 Drawing Sheets

(51) Int. Cl.

| | | |
|---|---|---|
| *G09F 9/33* | (2006.01) | |
| *G09F 9/302* | (2006.01) | |
| *H01L 27/32* | (2006.01) | |
| *F21V 5/00* | (2018.01) | |
| *H01L 51/52* | (2006.01) | |
| *F21Y 105/16* | (2016.01) | |
| *F21Y 115/15* | (2016.01) | |

(52) U.S. Cl.
CPC ......... *G02B 5/0284* (2013.01); *G09F 9/3026* (2013.01); *G09F 9/33* (2013.01); *H01L 27/3293* (2013.01); *H01L 51/5268* (2013.01); *F21Y 2105/16* (2016.08); *F21Y 2115/15* (2016.08)

(56) References Cited

U.S. PATENT DOCUMENTS

| | | | |
|---|---|---|---|
| 2005/0141242 A1* | 6/2005 | Takeuchi | G02B 6/0021 362/600 |
| 2011/0147773 A1* | 6/2011 | Kostka | G02B 1/11 257/98 |

FOREIGN PATENT DOCUMENTS

| | | |
|---|---|---|
| JP | 2005158369 A | 6/2005 |
| JP | 2005183352 A | 7/2005 |
| KR | 100856980 B1 | 9/2008 |

\* cited by examiner

LARGE AREA ORGANIC LIGHT EMITTING PANEL

CROSS-REFERENCE TO RELATED APPLICATIONS

The present application is a national phase entry under 35 U.S.C. § 371 of International Application No. PCT/KR2014/012206 filed Dec. 11, 2014, which claims priority from Korean Application No. 10-2013-0157993 filed Dec. 18, 2013, all of which are hereby incorporated herein by reference.

TECHNICAL FIELD

The present disclosure generally relates to a large-area organic light-emitting panel. The present disclosure also relates to a large-area organic light-emitting panel in which a no-joint effect is able to be realized, so that an observer in front of the large-area organic light-emitting panel cannot perceive joints between organic light-emitting panels.

BACKGROUND ART

Light-emitting devices may be generally divided into organic light-emitting devices in which a light-emitting layer is formed from an organic material, and inorganic light-emitting devices, in which a light-emitting layer is formed from an inorganic material. Organic light-emitting diodes (OLEDs), a component of organic light-emitting devices, are self-emitting light sources based on the radiative decay of excitons in an organic light-emitting layer, the excitons being generated by the recombination of electrons injected through an electron injection electrode (cathode) and holes injected through a hole injection electrode (anode). OLEDs have a range of desirable qualities, such as low-voltage driving, rapid response times, ability to self-emit light while providing a screen having a wide viewing angle, high resolution, and natural color reproducibility.

Recently, research into applying OLEDs to a variety of devices, such as personal data assistances (PDAs), cameras, watches, office equipment, vehicle dashboard display devices, televisions (TVs), display devices, lighting systems, and the like has been actively undertaken.

In order to improve the luminous efficiency of OLEDs, it is necessary to improve the luminous efficiency of a material constituting a light-emitting layer or to improve light extraction efficiency in terms of a level at which light generated by the light-emitting layer is extracted.

Here, light extraction efficiency depends on the refractive indices of the layers of materials that constitute an OLED. In a typical OLED, when a beam of light generated by the light-emitting layer is emitted at an angle greater than a critical angle, the beam of light may be totally reflected at the interface between a higher-refractivity layer, such as a transparent electrode layer, and a lower-refractivity layer, such as a glass substrate. This consequently lowers light extraction efficiency, thereby lowering the overall luminous efficiency of the OLED, which is problematic.

More specifically, only about 20% of light generated by an OLED is emitted outwardly while about 80% of the light generated by the OLED is lost due to a waveguide effect originating from the difference in refractive indices between a glass substrate and an organic light-emitting layer that includes an anode, a hole injection layer (HIL), a hole transporting layer (HTL), an emission layer (EML), an electron transporting layer (ETL), and an electron injection layer (EIL), as well as by the total internal reflection originating from the difference in refractive indices between the glass substrate and the ambient air. Here, the refractive index of the internal organic light-emitting layer ranges from 1.7 to 1.8, whereas the refractive index of indium tin oxide (ITO), generally used for the anode, is about 1.9. Since the two layers have a significantly low thickness, ranging from 200 nm to 400 nm, and the refractive index of the glass used for the glass substrate is about 1.5, a planar waveguide is thereby formed inside the OLED. It is estimated that the ratio of the light lost in the internal waveguide mode due to the above-described reason is about 45%. In addition, since the refractive index of the glass substrate is about 1.5 and the refractive index of the ambient air is 1.0, when light exits the interior of the glass substrate, a beam of light having an angle of incidence greater than a critical angle is totally reflected and trapped inside the glass substrate. The ratio of the trapped light is commonly about 35%, and only about 20% of generated light is emitted outwardly.

Recently, the worldwide trend in lighting systems and display systems employing such OLEDs is toward large areas. However, when lighting or display systems are fabricated to have large areas, risks are increased due to the sagging of substrates, increases in equipment prices, and so on. It is also difficult to fabricate large-area lighting or display systems. Therefore, in reality, there are limitations to large-area lighting or display systems.

PRIOR ART DOCUMENT

Korean Patent No. 10-0856980 (Aug. 29, 2008)

DISCLOSURE

Technical Problem

Accordingly, the present disclosure has been made in consideration of the above problems occurring in the related art, and the present disclosure is provided to propose a large-area organic light-emitting panel in which a no-joint effect is able to be realized, so that an observer in front of the large-area organic light-emitting panel cannot perceive joints between organic light-emitting panels.

Also provided is a large-area organic light-emitting panel able to overcome size limitations.

Technical Solution

According to an aspect of the present disclosure, a large-area organic light-emitting panel may include: a plurality of organic light-emitting panels arranged in rows and columns; and joints disposed between the plurality of organic light-emitting panels to connect the plurality of organic light-emitting panels. The joints refract light emitted sidewardly by the plurality of organic light-emitting panels due to a waveguide effect to be redirected forwardly.

Each of the joints may be a light-scattering layer including: a matrix layer; and a plurality of light-scattering particles dispersed in the matrix layer.

The matrix layer may be formed from a material, a refractive index of which is lower than a refractive index of an organic light-emitting layer of the plurality of organic light-emitting panels.

The thickness of the matrix layer may be inversely-proportional to the volume ratio of the light-scattering particles with respect to the matrix layer.

The widths of the joints may range from 100 μm to 500 μm.

The large-area organic light-emitting panel may further include a reflective film on rear surfaces of the joints.

Each of the plurality of organic light-emitting panels may include: a glass substrate; a first electrode disposed on the glass substrate; an organic light-emitting layer disposed on the first electrode; and a second electrode disposed on the organic light-emitting layer. A light extraction layer may be provided between the glass substrate and the first electrode and/or provided on an externally-exposed surface of the glass substrate.

The plurality of organic light-emitting panels may be used in a lighting system or a display system.

Advantageous Effects

According to the present disclosure, the joints connecting the plurality of organic light-emitting panels are formed as a light-scattering layer to realize a no-joint effect by refracting light emitted sidewardly by the plurality of organic light-emitting panels due to a waveguide effect to be redirected forwardly, so that an observer in front of the large-area organic light-emitting panel cannot perceive the joints between the organic light-emitting panels. This configuration can consequently allow screen quality or lighting quality that is substantially equal to those of large-area single panels when visually compared to be realized.

In addition, according to the present disclosure, it is possible to realize an extra-large display, such as an electric bulletin board or an electric scoreboard, by connecting the plurality of organic light-emitting panels. When the plurality of organic light-emitting panels are used in a lighting system, large-area lighting can be provided. That is, according to the present disclosure, limitations of size can be easily overcome in the fabrication of a large-area organic light-emitting panel for use in a display system or a lighting system.

Furthermore, according to the present disclosure, when the large-area organic light-emitting panel is used in a lighting system, only a defective organic light-emitting panel that has reached the end of its operational lifespan or has a dark spot or a hot spot can be individually replaced, whereby manufacturing and replacement costs thereof can be significantly reduced.

MODE FOR INVENTION

Hereinafter, reference will be made in detail to a large-area organic light-emitting panel according to an exemplary embodiment with reference to the accompanying drawings.

In the following description, detailed descriptions of known functions and components incorporated herein will be omitted in the case that the subject matter of the present disclosure is rendered unclear by the inclusion thereof.

Figure 1:
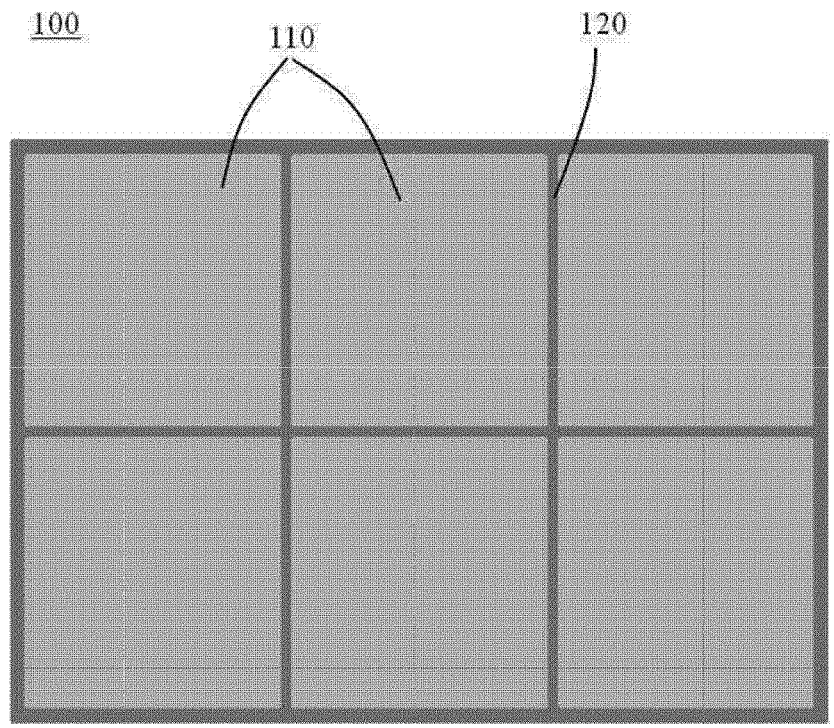
FIG. 1 is a top view illustrating a large-area organic light-emitting panel according to an exemplary embodiment.
Figure 2:
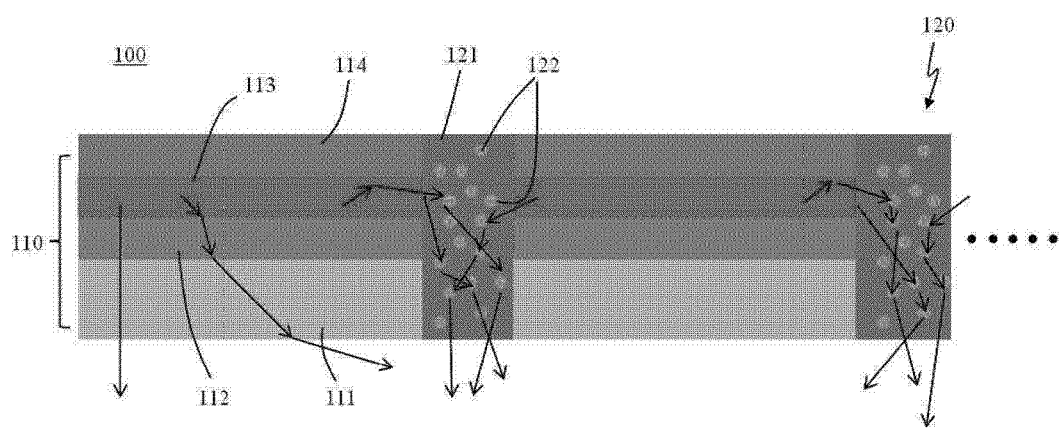
FIG. 2 is a cross-sectional view taken along line A-A in FIG. 1.

As illustrated in FIG. 1 and FIG. 2, a large-area organic light-emitting panel 100 according to an exemplary embodiment is a combination panel of organic light-emitting panels 110 used in a lighting system or a display system. In this regard, the large-area organic light-emitting panel 100 according to the present embodiment includes the plurality of organic light-emitting panels 110 and joints 120.

The plurality of organic light-emitting panels 110 are arranged in columns and rows, and form a panel assembly extended by means of the joints 120. Specifically, the large-area organic light-emitting panel 100 includes the plurality of organic light-emitting panels 110, connected in columns and rows to form an extra-large display. When the plurality of organic light-emitting panels 110 are used in a lighting system, large-area lighting is provided. In addition, since the large-area organic light-emitting panel 100 according to the present embodiment is a structure in which the plurality of organic light-emitting panels 110 are simply extended in columns and rows, the large-area organic light-emitting panel 100 may be manufactured to have a range of sizes or areas depending on the intended use thereof. Furthermore, when the unit organic light-emitting panels 110 of the large-area organic light-emitting panel 100 are used in a lighting system, a defective organic light-emitting panel 110 that has reached the end of its operational lifespan or has a dark spot or a hot spot can be individually replaced, whereby manufacturing and replacement costs can be significantly reduced, as compared to those of a single large-area panel.

Each of the unit organic light-emitting panels 110 forming the large-area organic light-emitting panel 100 as described above may include a glass substrate 111, a first electrode 112, an organic light-emitting layer 113, and a second electrode 114.

Here, the glass substrate 111 acts as a passage along which light generated by the organic light-emitting layer 113 is emitted outwardly. In this regard, the glass substrate 111 is disposed forwardly of the organic light-emitting layer 113, i.e. is disposed in the direction in which light generated by the organic light-emitting layer 113 is emitted outwardly. In addition, the glass substrate 111 serves to protect the first electrode 112, the organic light-emitting layer 113, and the second electrode from the external environment. The glass substrate 111 may be formed from soda-lime glass ($SiO_2$—CaO—$Na_2O$) or aluminosilicate glass ($SiO_2$—$Al_2O_3$—$Na_2O$) which are chemically-toughened. When the organic light-emitting panel 110 according to the present embodiment is used in a lighting system, the glass substrate 111 may be formed from soda-lime glass. In addition, the glass substrate 111 may be a thin glass plate having a thickness of 1.5 mm or less. The thin glass plate may be manufactured using a fusion process or a floating process. A light extraction layer or a light extraction pattern for improving light extraction efficiency may be formed on the front surface of the glass substrate 111, i.e. the externally-exposed surface of the glass substrate 111.

In addition, the first electrode 112 is formed on the glass substrate 111. The first electrode 112 is a transparent electrode acting as an anode of the organic light-emitting panel 110. The first electrode 112 may be formed from, for example, indium tin oxide (ITO) that has a higher work function to facilitate hole injection into the organic light-emitting layer 113. Here, a light extraction layer may be formed between the glass substrate 111 and the first electrode 112 in order to improve light extraction efficiency.

Furthermore, the organic light-emitting layer 113 is formed on the first electrode 112. The organic light-emitting layer 113 may include a hole injection layer, a hole transport layer, an emissive layer, an electron transport layer, and an electron injection layer sequentially stacked on the first electrode 112. Due to this structure of the organic light-emitting layer 113, when a forward voltage is applied between the first electrode 112 acting as the anode and the second electrode 114 acting as the cathode, electrons from the cathode migrate to the emissive layer through the electron injection layer and the electron transport layer, and holes from the anode migrate to the emissive layer through the hole injection layer and the hole transport layer. The electrons and the holes that have migrated into the emissive layer recombine with each other, thereby generating excitons. When excitons transit from an excited state to a ground state, light is emitted. The brightness of emitted light is proportional to the amount of current flowing between the anode and the cathode. When the organic light-emitting panels 110 according to the present embodiment form a white organic-light emitting panel used in a lighting system, the light-emitting layer may have, for example, a multilayer structure including a high-molecular light-emitting layer that emits blue light and a low-molecular light-emitting layer that emits orange-red light. In addition, the light-emitting layer may have a variety of other structures to emit white light. Furthermore, the organic light-emitting layer 113 may have a tandem structure. That is, a plurality of organic light-emitting layers 113 and interconnecting layers (not shown) alternating with the organic light-emitting layers 113 may be provided.

The second electrode 114 is formed on the organic light-emitting layer 113. The second electrode 114 is a metal electrode acting as a cathode of the organic light-emitting panels 110. The second electrode 114 may be a metal thin film formed from Al, Al:Li, or Mg:Ag that has a lower work function to facilitate electron injection into the organic light-emitting layer 113. The second electrode 114 may have micro-cavities defined therein like the first electrode 112. When the first electrode 112 and the second electrode 114 contain micro-cavity structures, light generated by the organic light-emitting layer 113 undergoes constructive interference and resonance within the micro-cavities, thereby improving luminance efficiency in the direction of the glass substrate 111.

The joints 120 are disposed between the plurality of organic light-emitting panels 110 arranged in columns and rows, and serve as a bonding material to connect the plurality of organic light-emitting panels 110. That is, the joints 120 are disposed on sides of the organic light-emitting panels 110. In addition, the joints 120 serve to refract incident light emitted sidewardly by the organic light-emitting panels 110 due to the waveguide effect to be redirected forwardly. When light emitted sidewardly by the organic light-emitting panels 110 is refracted forwardly as described above, an observer in front of the large-area organic light-emitting panel 100 cannot perceive the joints 120 connecting the plurality of organic light-emitting panels 110. The joints 120 of the large-area organic light-emitting panel 100 according to the present embodiment can allow a no-joint effect by refracting and forwardly-redirecting light that would otherwise be lost by being emitted sidewardly by the organic light-emitting layer 113, more particularly, by the organic light-emitting layer 113, to be realized. This configuration can consequently allow screen quality or lighting quality that is substantially equal to those of large-area single panels when visually compared to be realized.

In this regard, the joints 120 according to the present embodiment may be formed as a light-scattering layer including a matrix layer 121 and a plurality of scattering particles 122 dispersed in the matrix layer 121, the plurality of scattering particles 122 having different refractive indices. It is preferable that the matrix layer 121 be formed from a material, the refractive index of which is lower than the refractive index of the organic light-emitting layer 113 to more-efficiently receive light from the organic light-emitting layer 113 that would otherwise be lost. In addition, the thickness of the matrix layer 121 may be inversely proportional to the volume ratio of the light-scattering particles 122 with respect to the matrix layer 121. That is, a smaller number of light-scattering particles 122 are preferably distributed in a thicker matrix layer 121 than in a thinner matrix layer 121. In addition, when the large-area organic light-emitting panel 100 is manufactured by connecting the plurality of organic light-emitting panels 110, the distances between the organic light-emitting panels 110, i.e. the widths of the joints 120, may be controlled in the range of 100 µm to 500 µm.

Hereinafter, reference will be made to a large-area organic light-emitting panel according to another exemplary embodiment with reference to FIG. 3.

Figure 3:
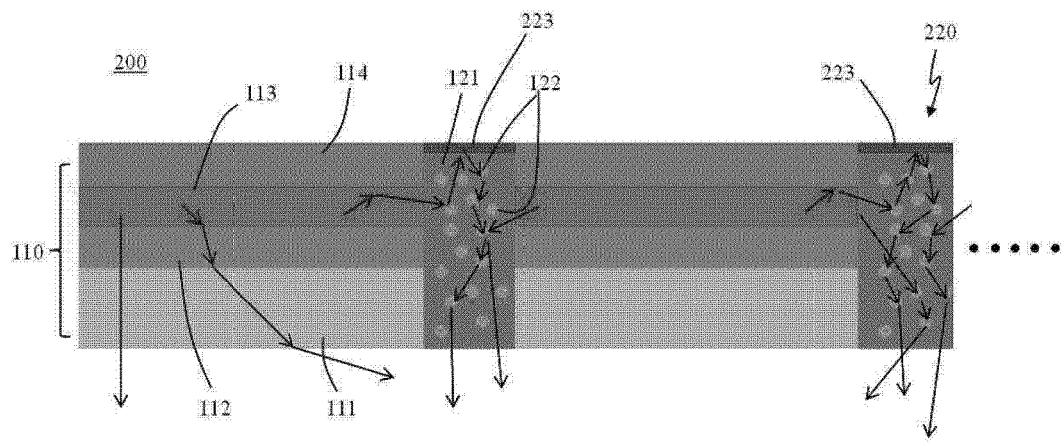
FIG. 3 is a cross-sectional view illustrating a large-area organic light-emitting panel according to another exemplary embodiment.

FIG. 3 is a cross-sectional view illustrating the large-area organic light-emitting panel according to the present embodiment.

As illustrated in FIG. 3, the large-area organic light-emitting panel 200 according to the present embodiment includes a plurality of organic light-emitting panels 110 and joints 220.

The components of the present embodiment are substantially the same as those of the former embodiment, except for the structure of the joints. The same components will be denoted by the same reference numerals and detailed descriptions thereof will be omitted.

A reflective film 223 is disposed on the joints 220 according to the present embodiment. Specifically, the reflective film 223 is formed on the rear surfaces of the joints 220, opposite to the front side through which light is emitted.

The reflective film 223 formed on the rear surfaces of the joints 220 as described above can forwardly redirect light emitted sidewardly and rearwardly by the organic light-emitting layer 113, thereby further enhancing the effect of hiding the joints 220 compared to that of the former embodiment.

Figure 4:
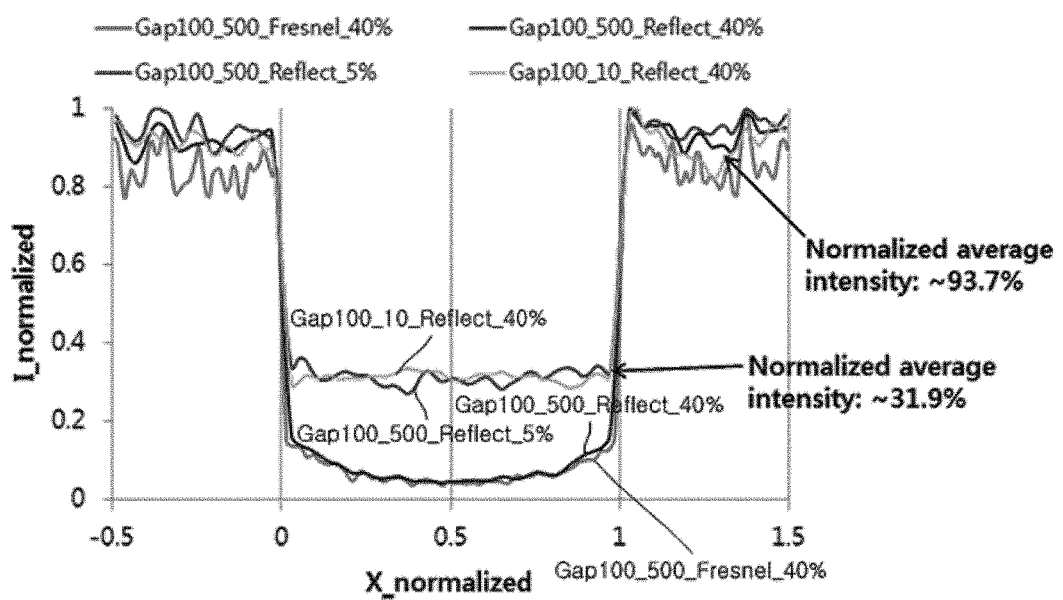
FIG. 4 is a graph illustrating ratios between light extracted from organic light-emitting panels and light reaching an observer after being refracted from joints, measured using light measurement tools.

Ratios between light extracted from the organic light-emitting panels and light reaching an observer after being refracted from the joints are measured using light tools to verify the effect of the joints according to embodiments of the present disclosure, and the results thereof are represented in the graph in FIG. 4. Referring to FIG. 4, for example, Gap100_500_Reflect_5% means that the distances between organic light-emitting panels are 100 µm, the thicknesses of the joints are 500 µm, a reflective film is provided, and the volume ratio of light-scattering particles is 5%.

Referring to FIG. 4, it can be seen that the volume ratio of the light-scattering particles is required to be lower when the joints are thicker so that the joints can have a high refraction effect. In contrast, when the joints are thinner, the volume ratio of the light-scattering particles is required to be greater. Specifically, in the case of Gap100_500_Reflect_5% and the case of Gap100_10_Reflect_40%, X coordinates and intensities are normalized for respective highest values, the average intensity of the organic light-emitting panels is 93.7%, and the average intensity of the joints is 31.9%. It is found that an amount of light corresponding to ⅓ of light that is waveguided is refracted by the joints forming a scattering layer without a light-emitting layer. When organic light-emitting panels on both sides of one of the joints have different colors, the color of the joint is the average of the colors of the organic light-emitting panels. Accordingly, an observer in front of the large-area organic light-emitting panel cannot perceive the joints between the organic light-emitting panels.

The foregoing descriptions of specific exemplary embodiments of the present disclosure have been presented with respect to the drawings. They are not intended to be exhaustive or to limit the present disclosure to the precise forms disclosed herein, and many modifications and variations are obviously possible for a person having ordinary skill in the art in light of the above teachings.

It is intended therefore that the scope of the present disclosure not be limited to the foregoing embodiments, but be defined by the Claims appended hereto and their equivalents.

DESCRIPTION OF REFERENCE NUMERALS
OF DRAWINGS

| | |
|---|---|
| 100, 200: large-area organic light-emitting panel | |
| 110: organic light-emitting panel | |
| 111: glass substrate | 112: first electrode |
| 113: organic light-emitting layer | 114: second electrode |
| 120, 220: joint | 121: matrix layer |
| 122: light-scattering particle | |
| 223: reflective film | |

The invention claimed is:

1. A large-area organic light-emitting panel comprising:
    a plurality of organic light-emitting panels arranged in rows and columns; and
    joints disposed between the plurality of organic light-emitting panels to connect the plurality of organic light-emitting panels, wherein the joints refract light emitted sidewardly by the plurality of organic light-emitting panels due to a waveguide effect to be redirected forwardly,
    wherein each of the joints comprises a light-scattering layer comprising:
    a matrix layer; and
    a number of light-scattering particles dispersed in the matrix layer,
    wherein the matrix layer of each joint is formed from a material, a refractive index of which is lower than a refractive index of an organic light-emitting layer of each of the plurality of organic light-emitting panels,
    wherein a smaller number of the light-scattering particles are distributed in a thicker matrix layer of a first joint than in a matrix layer of a second joint, which is thinner than the matrix layer of the first joint.

2. The large-area organic light-emitting panel of claim 1, wherein widths of the joints range from 100 μm to 500 μm.

3. The large-area organic light-emitting panel of claim 1, further comprising a reflective film on a rear surface of each of the joints.

4. The large-area organic light-emitting panel of claim 1, wherein each of the plurality of organic light-emitting panels comprises:
    a glass substrate;
    a first electrode disposed on the glass substrate;
    an organic light-emitting layer disposed on the first electrode; and
    a second electrode disposed on the organic light-emitting layer,
    wherein a light extraction layer is provided between the glass substrate and the first electrode and/or provided on an externally-exposed surface of the glass substrate.

5. The large-area organic light-emitting panel of claim 1, wherein the plurality of organic light-emitting panels are used in a lighting system or a display system.

* * * * *